United States Patent [19]

Oritani

[11] Patent Number: 4,539,661

[45] Date of Patent: Sep. 3, 1985

[54] STATIC-TYPE SEMICONDUCTOR MEMORY DEVICE

[75] Inventor: Atushi Oritani, Yokohama, Japan

[73] Assignee: Fujitsu Limited, Kawasaki, Japan

[21] Appl. No.: 508,505

[22] Filed: Jun. 28, 1983

[30] Foreign Application Priority Data

| Jun. 30, 1982 [JP] | Japan | 57-111519 |
| Jun. 30, 1982 [JP] | Japan | 57-111523 |
| Jun. 30, 1982 [JP] | Japan | 57-111535 |

[51] Int. Cl.³ .................. G11C 19/40; G11C 8/00
[52] U.S. Cl. .................... 365/230; 365/154; 365/190
[58] Field of Search .................. 365/154, 190, 230

[56] References Cited

U.S. PATENT DOCUMENTS

| 4,354,259 | 10/1982 | Ishimoto | 365/230 |
| 4,396,845 | 8/1983 | Nakano | 365/230 |
| 4,480,320 | 10/1984 | Naiff | 365/230 |

Primary Examiner—James W. Moffitt
Attorney, Agent, or Firm—Staas & Halsey

[57] ABSTRACT

In a static-type semiconductor memory device, one word line ($WL_0$, ---) and one pair of bit lines ($BL_0$, $\overline{BL}_0$, ---) are selected by row address decoders, column address decoders, and the like, upon receipt of address information so as to select one memory cell ($C_{00}$, ---). The row address decoders are activated by a word-line driver clock signal ($\phi_W$) of a word line driver. The word-line driver clock signal ($\phi_W$) is generated only during a predetermined time period after the change of address information, and, accordingly, the selection time period of the word line is small.

7 Claims, 32 Drawing Figures

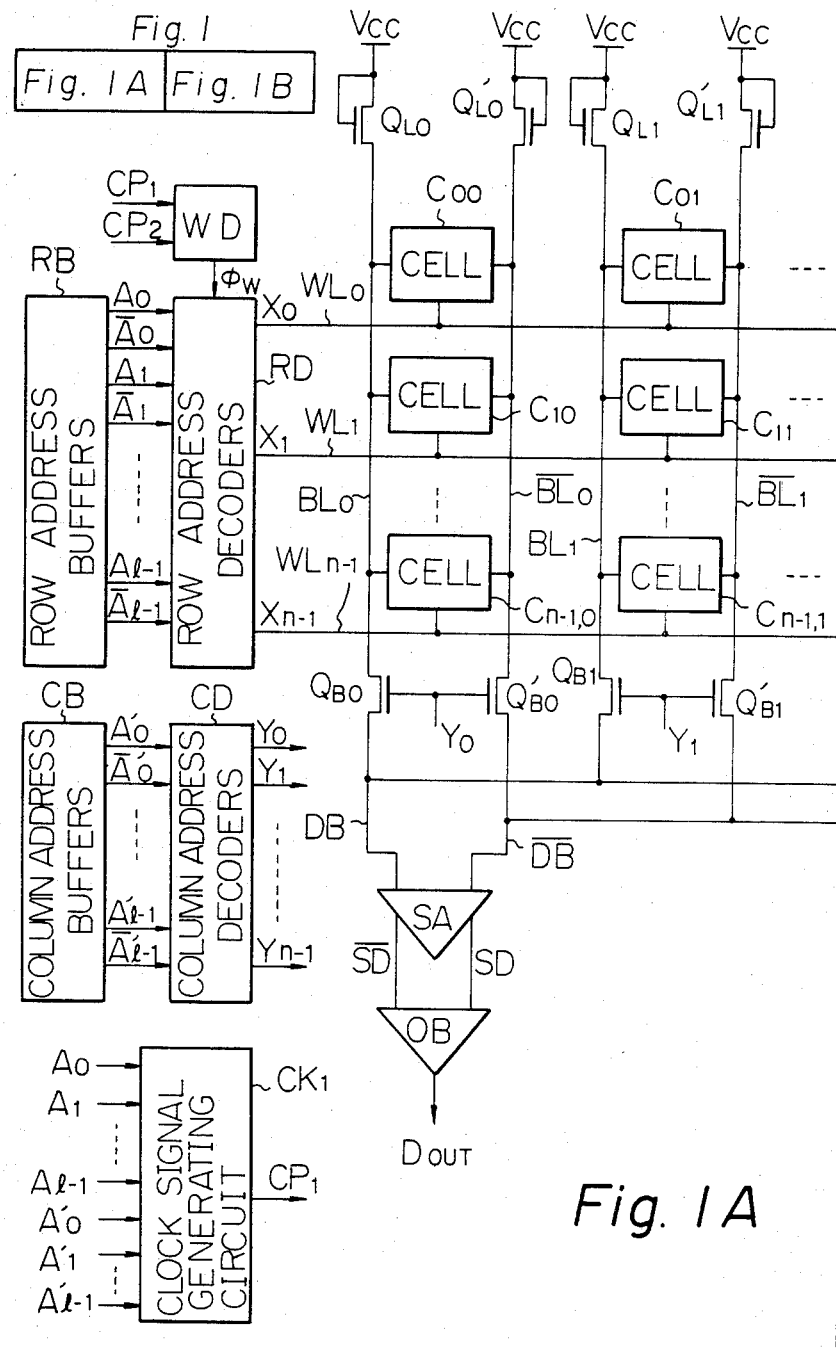

Fig. 3D

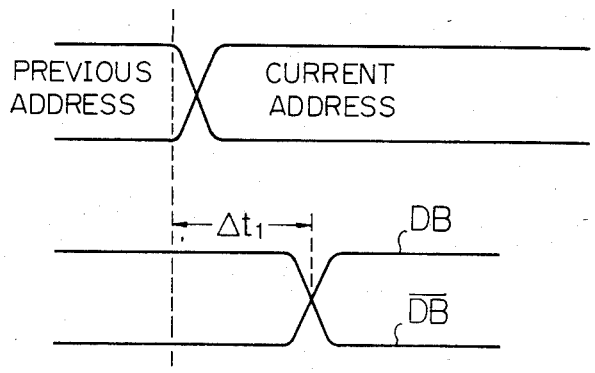
Fig. 4A PRIOR ART
Fig. 4B PRIOR ART
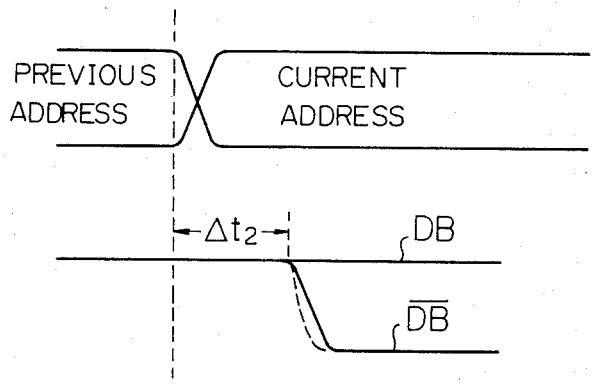
Fig. 5A
Fig. 5B

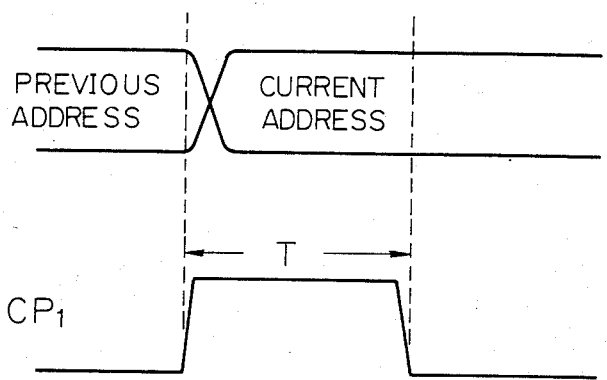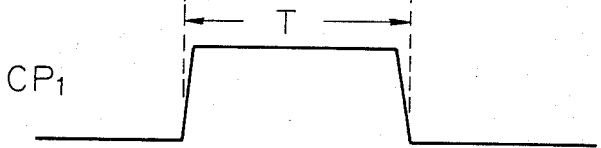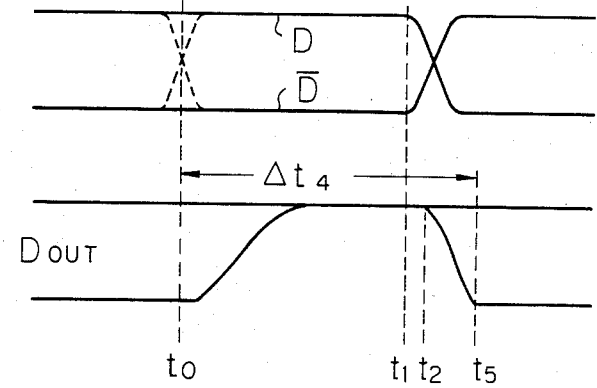

STATIC-TYPE SEMICONDUCTOR MEMORY DEVICE

BACKGROUND OF THE INVENTION (1) Field of the Invention

The present invention relates to a metal-oxide semiconductor (MOS) static-type semiconductor memory device.

(2) Description of the Prior Art

Generally, in a MOS static-type semiconductor memory device, one static-type memory cell constructed as a flip-flop is provided at each intersection of word line and bit line pairs, and one word line and one bit line are selected by address means, such as row address buffers, row address decoders, column address buffers, column address decoders, and the like, so that one memory cell is selected. In this case, the actual selection of one word line is performed by a word-line driver clock signal after the row address decoders determine a selected row. Thus, when one word line is selected, a large number of non-selected memory cells connected to the selected word line are also electrically connected to corresponding bit line pairs. For example, in a 16K bit memory, 127 non-selected memory cells are electrically connected to corresponding bit lines. As a result, current flows from the corresponding bit lines into these memory cells. The dissipation of power of a static semiconductor memory device is mainly due to the driving of such a bit line load.

In the prior art, in a selected state, i.e., after external signals (such as a row access strobe signal) are received, the word-line driver clock signal becomes high so that at least one of the word lines is always in a selected state. Therefore, the dissipation of power is remarkably large.

On the other hand, the bit line pairs are connected, via load transistors, to a power supply. Therefore, in a non-selected mode, the bit line pairs are charged at a predetermined potential by the power supply. However, in a selected mode, such as a read mode, memory cells connected to a selected word line are electrically connected to the corresponding bit line pairs so that current flows from the bit lines into the memory cells. As a result, a difference in potential between the bit lines is generated, the difference in potential is sensed or amplified by a sense amplifier, and data output is transmitted, via an output buffer, to the exterior. At this time, in order to generate a suitable difference in potential between the bit lines, a suitable relationship is formed between the transconductance ($g_m$) of the transistors within the memory cells and the transconductance $g_m$ of the load transistors. Therefore, it is impossible to increase or decrease the transconductance ($g_m$) of the load transistors.

Recently, much progress has been made in integrated MOS static-type semiconductor memory devices, and, accordingly, the size of the memory cells has been reduced. In this case, naturally, since the transconductance ($g_m$) of the transistors within the memory cells is reduced, the transconductance ($g_m$) of the load transistors is also reduced. However, since the capacitance of the bit lines is large, the driving power of the memory cells for the bit lines is small. Accordingly, the speed of change of the bit line potential becomes small, thereby reducing the read operation speed.

SUMMARY OF THE INVENTION

It is an object of the present invention to provide a static-type semiconductor memory device in which the dissipation of power is reduced and the read operation speed is enhanced.

According to the present invention, a word-line driver clock signal is generated only during a predetermined time period after the change of address information. That is, the selection time period of a word line is reduced, and, accordingly, the current flowing from the bit lines into the memory cells is also reduced. Thus, the dissipation of power is reduced. In addition, even in a previous read cycle, when the selection time period passes, the potential of each bit line remains high. Therefore, the read operation speed is dependent only upon the change of one bit line potential from a high level to a low level, which helps to enhance the read operation speed.

BRIEF DESCRIPTION OF THE DRAWINGS

The present invention will be more clearly understood from the description as set forth below with reference to the accompanying drawings, wherein:

FIGS. 1A and 1B are block diagrams of an embodiment of a static-type semiconductor memory device according to the present invention;

FIGS. 3A through 3I are timing diagrams of the signals appearing in the circuit of FIGS. 1A and 1B;

FIGS. 4A and 4B are timing diagrams of the read operation speed of the prior art;

FIGS. 5A and 5B are timing diagrams of the read operation speed according to the embodiment of the present invention in FIGS. 1A and 1B;

FIGS. 11A through 11D are timing diagrams of the read operation speed according to the embodiment of the present invention in FIGS. 9A and 9B.

DESCRIPTION OF THE PREFERRED EMBODIMENTS

In FIG. 1, which is one embodiment of the present invention, known static-type memory cells $C_{ij}$ (i,j = 0, 1, - - -, n−1) are arranged in an n-row, n-column, matrix. Each memory cell is conducted to one word line and a pair of bit lines. For example, a memory cell $C_{00}$ is connected to a word line $WL_0$ and to bit lines $BL_0$ and $\overline{BL_0}$. Selection of the word lines $WL_0$, $WL_1$, - - - , $WL_{n-1}$ is performed by the row-selection signals $X_0$, $X_1, \text{---}, X_{n-1}$ of row address decoders RD. In this case, the row address decoders RD decode the address signals $A_0, \overline{A}_0, A_1, \overline{A}_1, \text{---}, A_{l-1}, \overline{A}_{l-1}$ ($2^l = n$). However, the generation of the above-mentioned row-selection signals $X_0, X_1, \text{---}, X_{n-1}$ requires the generation of a word-line driver clock signal $\phi_W$ of a word line driver WD. In addition, the bit lines $BL_0, \overline{BL}_0, BL_1, \overline{BL}_1, \text{---}, BL_{n-1}, \overline{BL}_{n-1}$ are connected to column-selection gates $Q_{B0}, Q_{B0}', Q_{B1}, Q_{B1}', \text{---}, Q_{B,n-1}, Q_{B,n-1}'$, respectively, and each gate pair is controlled by column-selection signals $Y_0, Y_1, \text{---}, Y_{n-1}$. That is, the selection of the bit line pairs is performed by the column-selection signals $Y_0, Y_1, \text{---}, Y_{n-1}$ of column address decoders CD, and, in this case, the column address decoders CD decode the address signals $A_0', \overline{A}_0', \text{---}, A_{l-1}', \overline{A}_{l-1}'$. A pair of bit lines is connected, via selected column-selection gates, to data bit lines DB and $\overline{DB}$. A sense amplifier SA is connected to the data bit lines DB and $\overline{DB}$, and an output buffer OB is connected to the outputs of the sense amplifier SA.

The word line driver WD is set by the rise of a clock signal $CP_1$ of a clock signal-generating circuit $CK_1$ and is reset by the rise of a clock signal $CP_2$ of a clock signal-generating circuit $CK_2$. The clock signal-generating circuit $CK_1$ detects the change of the address signals $A_0, A_1, \text{---}, A_{l-1}, A_0', A_1', \text{---}, A_{l-1}'$ and generates the clock signal $CP_1$ while the clock signal-generating circuit $CP_2$ detects the rise of the row-selection signals $X_0, X_1, \text{---}, X_{n-1}$. The clock signal-generating circuit $CK_2$ is located at the terminals of the word lines $WL_0, WL_1, \text{---}, WL_{n-1}$ on the opposite side of the row address decoders RD. That is, the clock signal-generating circuit $CK_2$ detects the timing of a row-selection signal when it propagates to the terminal of the corresponding word line, with the result that the clock signal $CP_2$ is generated.

Figure 1B:
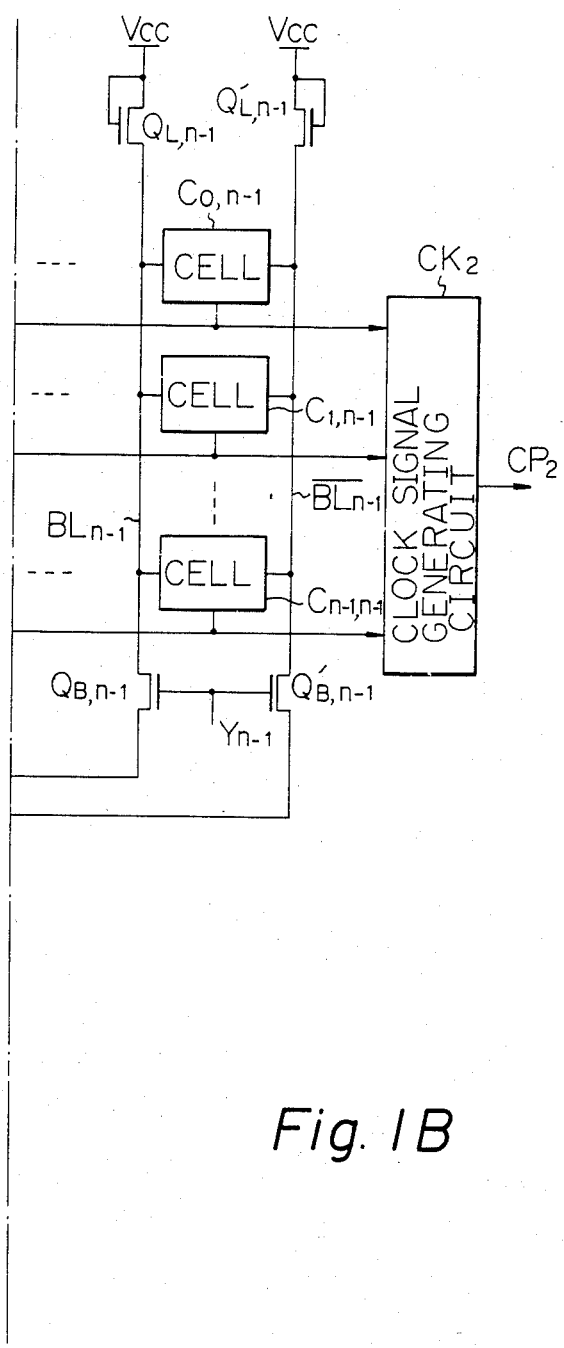

In FIGS. 1A and 1B, $Q_{L0}, Q_{L0}', Q_{L1}, Q_{L1}', \text{---}, Q_{L,n-1}, Q_{L,n-1}'$ designate load transistors connected between the bit lines $BL_0, \overline{BL}_0, BL_1, \overline{BL}_1, \text{---}, BL_{n-1}, \overline{BL}_{n-1}$, and a power supply $V_{CC}$. These load transistors are used for charging the bit lines.

Figure 2:
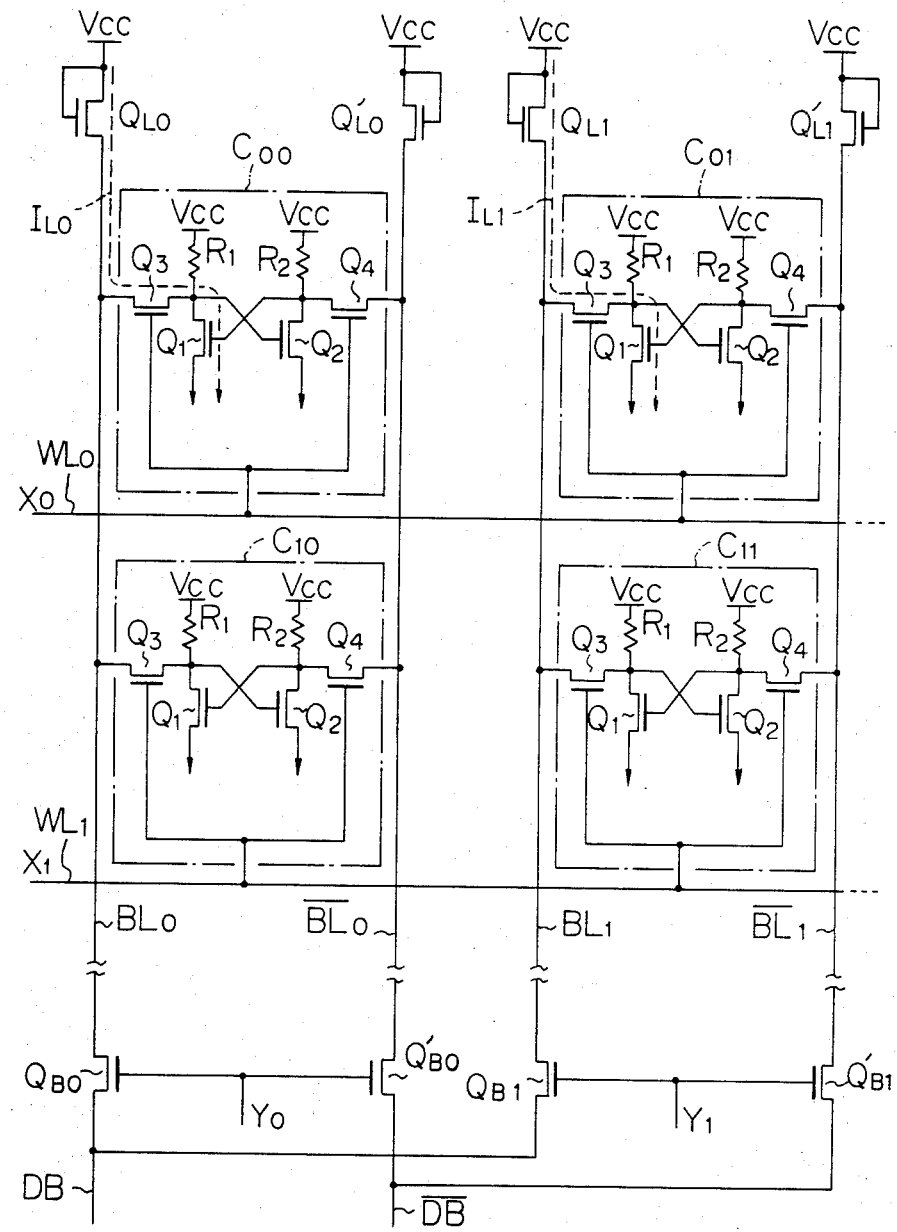
FIG. 2 is a circuit diagram of the memory cells $C_{00}$, $C_{01}$, $C_{10}$, and $C_{11}$ of FIG. 1A.

In FIG. 2, which is a circuit diagram of the memory cells $C_{00}, C_{01}, C_{10}$, and $C_{11}$ of FIG. 1, each memory cell comprises loads $R_1$ and $R_2$, cross-coupled driver transistors $Q_1$ and $Q_2$ a forming flip-flop, and transfer gate transistors $Q_3$ and $Q_4$. The transfer gate transistors $Q_3$ and $Q_4$ are connected to the bit lines $BL_0$ and $\overline{BL}_0$ (or $BL_1$ and $\overline{BL}_1$), respectively. These transistors are turned on and off by the row-selection signal $X_0$ (or $X_1$) at the word line $WL_0$ (or $WL_1$). For example, when the row-selection signal $X_0$ is high, a current $I_{L0}$ flows from the bit line $BL_0$ to the on-state transistor $Q_1$ of the memory cell $C_{00}$, and a current $I_{L1}$ flows from the bit line $BL_1$ to the on-state transistor $Q_1$ of the memory cell $C_{01}$. That is, in this case, even when the memory cell $C_{00}$ is selected, a current flows through the non-selected memory cell $C_{01}$. In a 16K bit memory, the number of such non-selected cells is 127. Therefore, a reduction of the above-mentioned current is advantageous with respect to the dissipation of power. In the present invention, even when a word line such as $WL_0$ is in a selected state, the duration of the high potential of the row-selection signal $X_0$ is limited so as to reduce the dissipation of power.

Figure 3A:
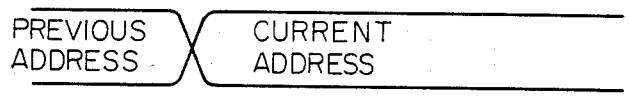
Figure 3B:
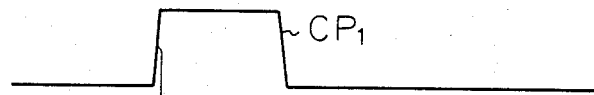
Figure 3C:
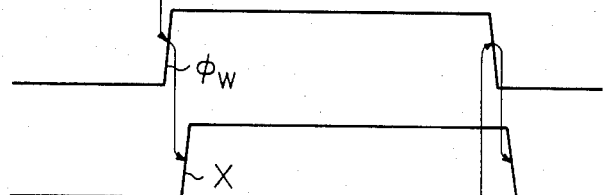
Figure 3E:
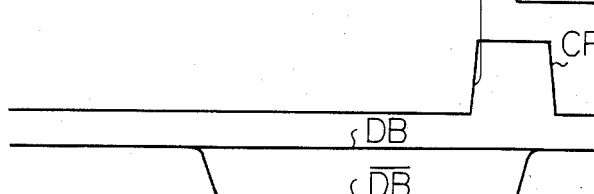

Referring back to FIG. 1, the operation of the circuit thereof is explained with reference to FIGS. 3A through 3I. As is illustrated in FIG. 3A, when one of the address signals $A_0, A_1, \text{---}, A_{l-1}, A_0', A_1', \text{---}, A_{l-1}'$ changes, the clock signal-generating circuit $CK_1$ detects such a change and generates the clock signal $CP_1$ shown in FIG. 3B. As a result, the word-line driver WD is set so as to generate the word-line driver clock signal $\phi_W$, and, subsequently, the row-selection signal of a selected word line is changed as shown in FIG. 3D. Thus, as the selecting operation proceeds, the potential at the terminal of the selected word line is changed from low to high. The clock signal-generating circuit $CK_2$ detects such a change and generates a clock signal $CP_2$ as shown in FIG. 3E. As a result, the word line driver WD is reset, and, accordingly, the word-line driver clock signal $\phi_W$ becomes low as shown in FIG. 3D. Therefore, the selected state of a word line is maintained only between the rise of the clock signal $CP_1$ and the rise of the clock signal $CP_2$.

Figure 3F:
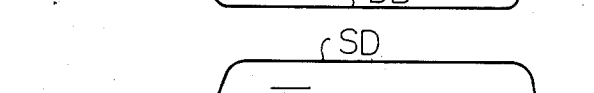
Figure 3G:
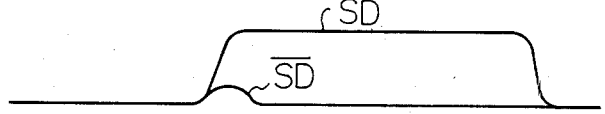
Figure 3H:
Figure 3I:

During the above-mentioned time period, the selected bit line pair is connected, by one of the column-selection signals $Y_0, Y_1, \text{---}, Y_{n-1}$, to the data bit line pair DB and $\overline{DB}$, whose potentials change as shown in FIG. 3F. The potentials of the data bit line pair DB and $\overline{DB}$ are amplified by the sense amplifier SA, which, in turn, generates sense data SD and $\overline{SD}$. The sense data SD and $\overline{SD}$ are maintained in a latch circuit of the output buffer OB. The data of the latch circuit, defined by D and $\overline{D}$, are shown in FIG. 3H, and the data output $D_{OUT}$ of the output buffer OB is shown in FIG. 3I. That is, since the determination of the data D and $\overline{D}$ of the latch circuit is performed between the rise of the clock signal $CP_1$ and the rise of the clock signal $CP_2$, it is unnecessary to maintain the selected state of a word line after the generation of the clock signal $CP_2$. In view of this, in the present invention, the selected state of a word line is no longer maintained after the generation of the clock signal $CP_2$, thereby reducing the dissipation of power in the memory cells.

It should be noted that the potentials of the data bit lines DB and $\overline{DB}$ are both high at the end of the previous address cycle since the word-line driver clock signal $\phi_W$ remains low, thereby helping to enhance the read operation speed, which is explained with reference to FIGS. 4A, 4B, 5A and 5B. That is, in the prior art, in a selected mode, the word-line driver clock signal $\phi_W$ always remains high, and, accordingly, the potential of one of the data bit lines DB and $\overline{DB}$ is high while the potential of the other is low. Therefore, if the address is changed as shown in FIG. 4A, the potentials of the data bit lines DB and $\overline{DB}$ may be reversed as shown in FIG. 4B. In this case, the read operation speed is dependent upon the time period $\Delta t_1$ determined by the intersection of the potentials of the data bit lines DB and $\overline{DB}$. On the contrary, in the present invention, when the address is changed as shown in FIG. 5A, only one of the potentials of the data bit lines DB and $\overline{DB}$ is changed from high to low. In this case, the read operation speed is dependent upon the time period $\Delta t_2$ determined by the point of separation of the potentials of the data bit lines DB and $\overline{DB}$. Thus, the read operation speed is improved as compared with the prior art.

Next, the configuration of each portion of the circuit of FIG. 1 is explained with reference to FIGS. 6, 7A, 7B, 8A and 8B.

Figure 6:
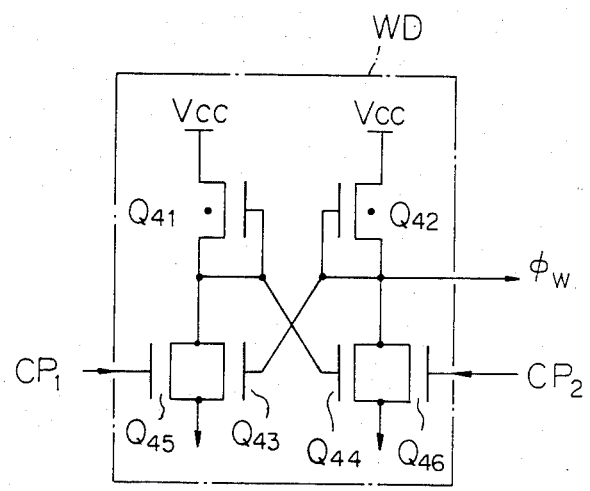
FIG. 6 is a circuit diagram of the word line driver WD of FIG. 1.

In FIG. 6, which is the word line driver WD of FIG. 1, $Q_{41}$ and $Q_{42}$ are load transistors, $Q_{43}$ and $Q_{44}$ are transistors forming a flip-flop, and $Q_{45}$ and $Q_{46}$ are input transistors. That is, the clock signal $CP_1$ serves as a set signal, and the clock signal $CP_2$ serves as a reset signal.

Therefore, the word-line driver clock signal $\phi_W$ is set by the rise of the clock signal $CP_1$ and is reset by the rise of the clock signal $CP_2$.

Figure 7A:
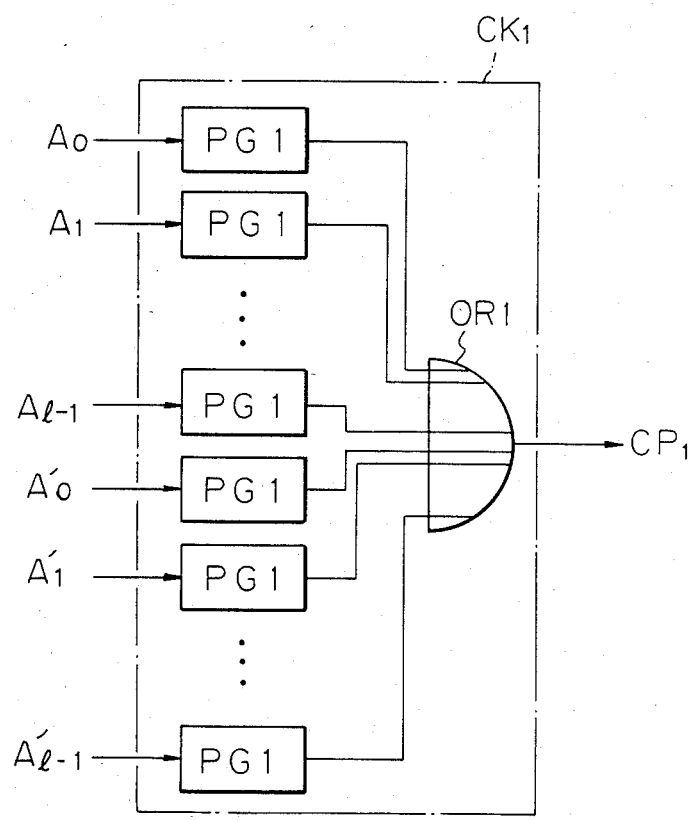
FIG. 7A is a circuit diagram of the clock signal-generating circuit $CK_1$ of FIG. 1A.
Figure 7B:
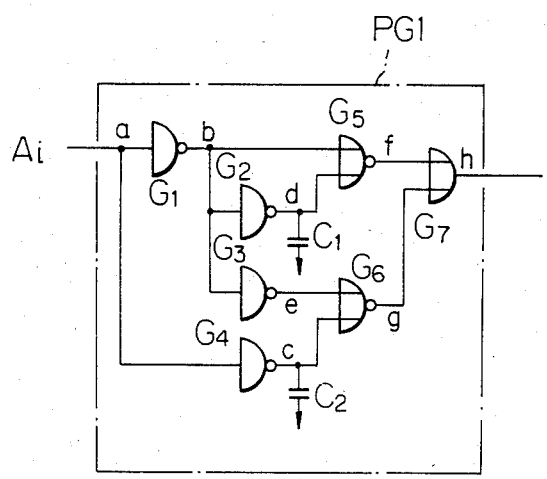
FIG. 7B is a logic circuit diagram of the signal-generating circuit PG1 of FIG. 7A.
Figure 7C:
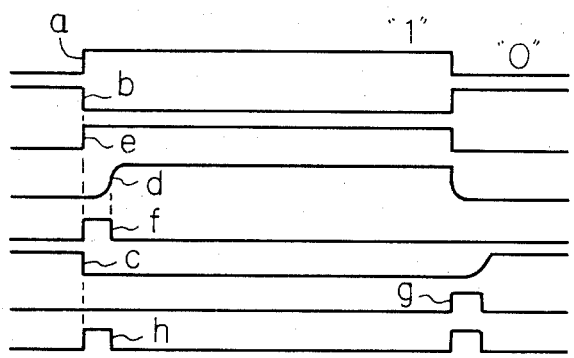
FIG. 7C is a timing diagram of the signals appearing in the circuit of FIG. 7B.

In FIG. 7A, which is the clock signal-generating circuit $CK_1$ of FIG. 1, the clock signal-generating circuit $CK_1$ comprises a plurality of signal-generating circuits PG1, corresponding to each of the address signals $A_0, A_1, ---, A_{l-1}, A_0', A_1', ---, A_{l-1}'$, and an OR gate OR1. The signal-generating circuits PG1 detect a change of the address signal and generate a pulse having a predetermined time period. For example, as is illustrated in FIG. 7B, the signal-generating circuit PG1 comprises NAND gates $G_1$ through $G_4$, NOR gates $G_5$ and $G_6$, an OR gate $G_7$, and capacitors $C_1$ and $C_2$. In this case, the gates $G_1$, $G_2$, and $G_5$ and the capacitor $C_1$ form a rise-detecting circuit, and the gates $G_1$, $G_3$, $G_4$, and $G_6$ and the capacitor $C_2$ form a fall-detecting circuit. Therefore, the output of the gate $G_7$ detects the rise and fall of the address signal $A_i$, i.e., the change thereof, and generates the signal $CP_1$. In more detail, referring to FIG. 7C, the address signal $A_i$ (node a) is changed from "1" to "0", the output b of the NAND gate $G_1$ changes and the output d of the NAND gate $G_2$ is an inverted signal of the signal b, which is delayed a little by the capacitor $C_1$. As a result, the output f of the NOR gate $G_5$ is a pulse which is generated by the rise of the address signal $A_i$. Similarly, the output g of the NOR gate $G_6$ is a signal which is generated by the fall of the address signal $A_i$. Therefore, the output h of the OR gate $G_7$, which combines the signal f with the signal g, is a clock signal which is generated by the change of the address signal $A_i$.

In FIG. 7A, a signal-generating circuit PG1 as illustrated in FIG. 7B is provided for each address signal, and, accordingly, the clock signal-generating circuit $CK_1$ generates a clock signal $CP_1$ when any one of the address signals is changed.

Figure 8A:
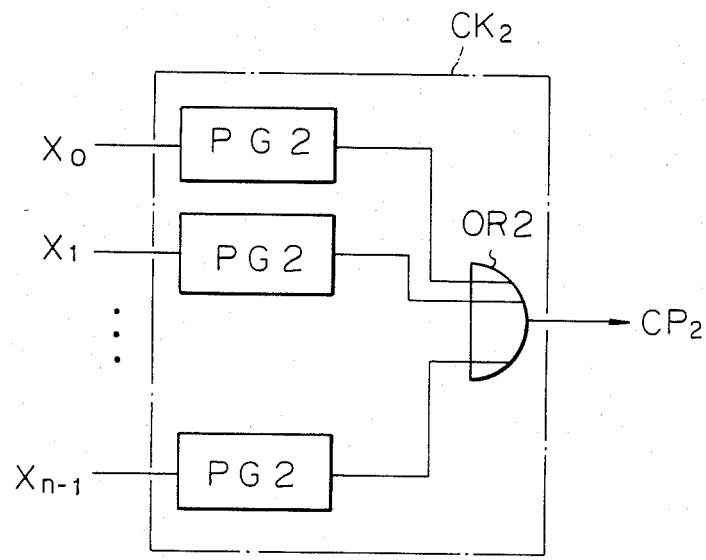
FIG. 8A is a block diagram of the clock signal-generating circuit $CK_2$ of FIG. 1B.
Figure 8B:
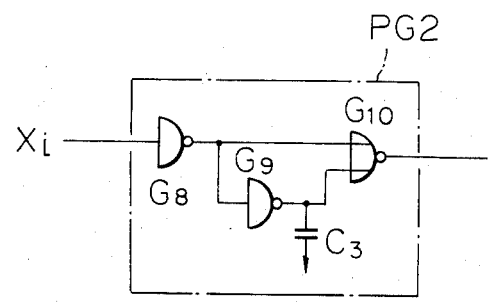
FIG. 8B is a logic circuit diagram of the signal-generating circuit PG2 of FIG. 8A.

In FIG. 8A, which is the clock signal-generating circuit $CK_2$ of FIG. 1B, the clock signal-generating circuit $CK_2$ comprises a plurality of signal-generating circuits PG2, corresponding to the row address signals $X_1, X_2, ---, X_{n-1}$, and an OR gate OR2. The signal-generating circuits PG2 detect a rise in the address signal and generate a signal having a predetermined time period. The signal-generating circuit PG2 shown in FIG. 8B comprises NAND gates $G_8$, $G_9$, a NOR gate $G_{10}$, and a capacitor $C_3$.

Figure 9A:
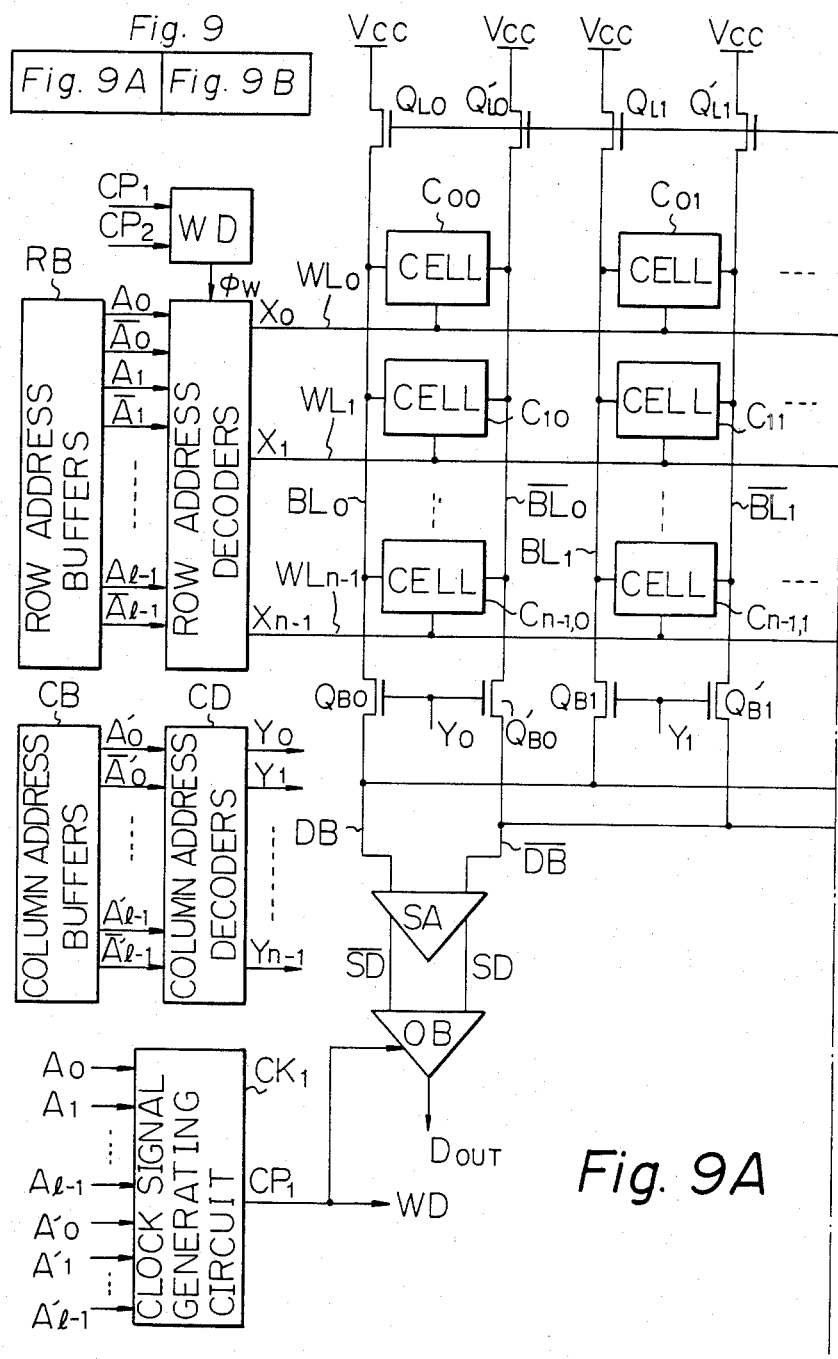
FIGS. 9A and 9B are block diagrams of another embodiment of a static-type semiconductor memory device according to the present invention.
Figure 9B:
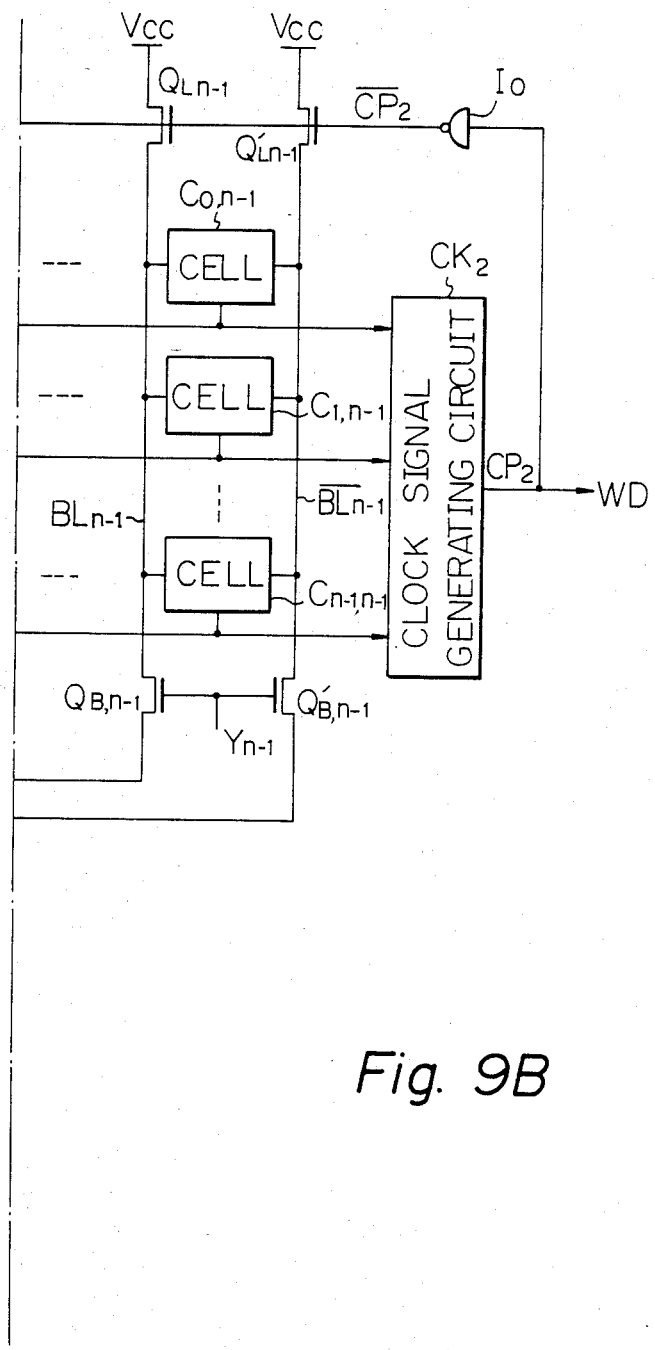

In FIG. 9, which is another embodiment of the present invention, the output buffer OB is controlled by the clock signal $CP_1$ of the clock signal-generating circuit $CK_1$, and the load transistors $Q_{L0}, Q_{L0}', Q_{L1}, Q_{L1}', ---, Q_{L,n-1}, Q_{L,n-1}'$ are controlled by an inverted signal $\overline{CP_2}$ of the clock signal $\overline{CP_2}$ of the clock signal-generating circuit $CK_2$. In this case, the signal $CP_2$ is obtained by an inverter $I_0$.

The clock signal $CP_1$ controls the output buffer OB so that the data output $D_{OUT}$ thereof is temporarily maintained at a high level when an address is changed and thereafter to obtain an essentially effective data output so as to enhance the read operation speed.

Figure 10A:
FIGS. 10A through 10C are timing diagrams of the read operation speed of the prior art.
Figure 10B:
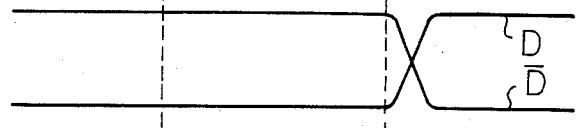
Figure 10C:
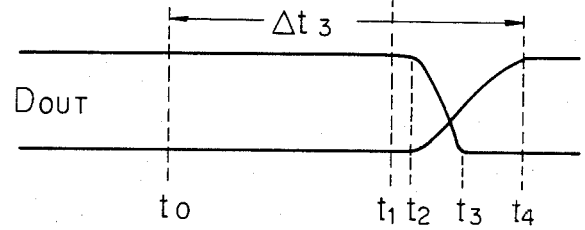

First, the operation of the output buffer OB, without being controlled by the clock signal-generating circuit $CK_1$, is explained with reference to FIGS. 10A, 10B, and 10C. That is, at a time $t_0$, the potential of the address changes as shown in FIG. 10A, and after that, at a time $t_1$, the potentials of the latch data D and $\overline{D}$ of the output buffer OB are changed. Of course in this case, even when the address is changed, the potentials of the sense data SD and $\overline{SD}$ (FIG. 9) are not changed if the data is the same. When the potentials of the latch data D and $\overline{D}$ are changed, the potential at the data output $D_{OUT}$ of the output buffer changes at a time $t_2$. However, if the capacitance of the output load is large, the change from a high level to a low level terminates at a time $t_3$ while the change from a low level to a high level terminates at a time $t_4$. That is, this difference is due to the difference between the charging operation and the discharging operation for the output load capacitance. Therefore, the read operation speed is dependent upon the time period $\Delta t_3$, which is relatively long.

However, in the output buffer OB, controlled by the clock signal-generating circuit $CK_2$, after the change in the address, the data output $D_{OUT}$ of the output buffer is maintained at a high level for a predetermined time period regardless of the potentials of the sense data SD and $\overline{SD}$ of the sense amplifier SA. That is, as is shown in FIGS. 11A and 11B, the clock signal $CP_1$ is generated during a predetermined time period T after the time $t_0$ when the address is changed. By using this clock signal $CP_1$, the latch data D is caused to assume a high level and the latch data $\overline{D}$ is caused to assume a low level, as is shown in FIG. 11C. Therefore, the data output $D_{OUT}$ of the output buffer is pushed up or maintained regardless of the potential of the sense data SD and $\overline{SD}$, as is illustrated in FIG. 11D. After that, at a time $t_2$, the potential of the data output $D_{OUT}$ changes. However, as is illustrated in FIG. 11D, this potential changes only from a high level to a low level. Therefore, the read operation speed is dependent upon the time period $\Delta t_4$ and, accordingly, is fast.

Figure 12:
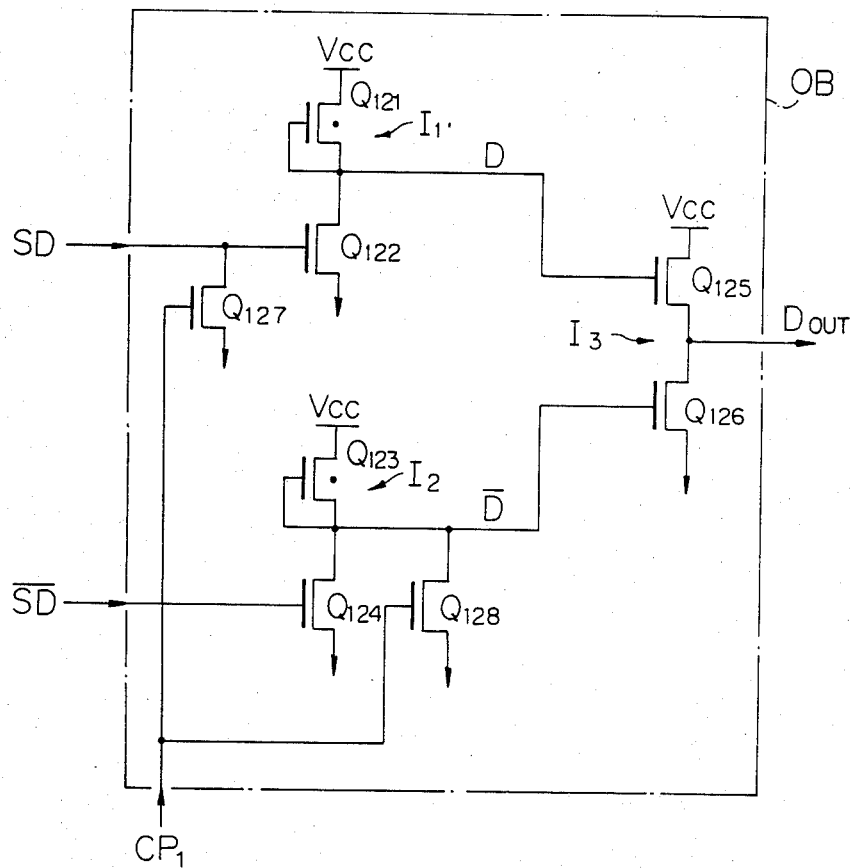
FIG. 12 is a circuit diagram of the output buffer OB of FIG. 9A.

In FIG. 12, which is the output buffer OB of FIG. 9, the sense data SD is supplied to an inverter $I_1$ formed by a depletion-type transistor $Q_{121}$ and an enhancement-type transistor $Q_{122}$ while the sense data SD is supplied to an inverter $I_2$ formed by a depletion-type transistor $Q_{123}$ and an enhancement-type transistor $Q_{124}$. In addition, the output of the inverter $I_1$ is connected to a charging transistor $Q_{125}$ of an inverter $I_3$, and the output of the inverter $I_2$ is connected to a discharging transistor $Q_{126}$ of the inverter $I_3$. Further, a transistor $Q_{127}$ is connected to the input side of the inverter $I_1$, and a transistor $Q_{128}$ is connected to the output of the inverter $I_2$. These transistors $Q_{127}$ and $Q_{128}$ are controlled by the clock signal $CP_1$ of the clock signal-generating circuit $CK_1$.

First, a case where the clock signal $CP_1$ is at a low level is explained. The potential of the sense data $\overline{SD}$ is inverted by the inverter $I_1$, and the potential of the sense data $\overline{SD}$ is inverted by the inverter $I_2$. Therefore, usually, since the same data $\overline{SD}$ is at a high level while the sense data SD is at a low level or vice versa, one of the transistors $Q_{125}$ and $Q_{126}$ is in an on-state while the other is in an off-state. For example, when the transistor $Q_{125}$ is in an on-state, the data output $D_{OUT}$ becomes high due to the charging operation of the transistor $Q_{125}$. On the other hand, when the transistor $Q_{126}$ is in an on-state, the data output $D_{OUT}$ becomes low due to discharging operation of the transistor $Q_{126}$. That is, the potential of the data output $D_{OUT}$ changes in accordance with a change in the potential of the sense data SD and $\overline{SD}$.

When the clock signal $CP_1$ is at a high level, the transistor $Q_{127}$ is turned on so that the input of the inverter $I_1$ becomes low while the output of the inverter $i_1$ becomes high. As a result, the transistor $Q_{125}$ is turned on. That is, the charging transistor $Q_{125}$ is turned on regardless of the potential of the sense data SD. Simultaneously, since the transistor $Q_{128}$ is turned on, the output of the inverter $I_2$ becomes low, and, accordingly, the discharging transistor $Q_{126}$ is turned off. That is, the discharging transistor $Q_{126}$ is turned off regardless of the potential of the sense data $\overline{SD}$. As a result the data output $D_{OUT}$ becomes high.

Next, the operation of the load transistors $Q_{L0}$, $Q_{L0}'$, $Q_{L1}$, $Q_{L1}'$, - - -, $Q_{L,n-1}$, $Q_{L,n-1}'$ of FIG. 9 is explained. That is, when the signal $\overline{CP_2}$ is low, the load transistors are cut off. As a result, the bit lines $BL_0$, $\overline{BL_0}$, $BL_1$, $\overline{BL_1}$, - - -, $BL_{n-1}$, $\overline{BL_{n-1}}$ are disconnected from the power supply $V_{CC}$ for a predetermined time period. In this case, therefore, the charging operation for the bit lines is suspended to increase the driving power of the memory cells for the bit lines. Thus, in the read mode, since the bit lines $BL_0$, $\overline{BL_0}$, $BL_1$, $\overline{BL_1}$, - - -, $BL_{n-1}$, $\overline{BL_{n-1}}$ are disconnected from the power supply $V_{CC}$, the difference in potential between the bit lines is rapidly increased, as is indicated by the dotted line in FIG. 5B, thereby improving the read operation speed.

Note that the above-mentioned control of the load transistors is effective particularly when the memory cells located near the clock signal-generating circuit are selected since the signal $\overline{CP_2}$ begins to fall after the terminal potential of a word line rises.

I claim:

1. A static-type semiconductor memory device operatively connectable to receive row address and column-address information signals, comprising:
   first and second power supply terminals;
   a plurality of word lines;
   a plurality of pairs of bit lines intersecting said plurality of word lines;
   a plurality of load means, each of said plurality of load means operatively connected to one of said bit lines and to said first power supply terminal, for charging said plurality of pairs of bit lines;
   a plurality of static memory cells, each of said plurality of static memory cells operatively connected to one of said word lines and to one of said pairs of bit lines;
   row-addressing means, operatively connected to said word lines and operatively connected to receive the row-address information signals, for selecting one of said word lines upon receipt of the row-address information signals;
   column-addressing means, operatively connected to said plurality of bit line pairs and operatively connected to recive the column address information signals, for selecting one of said bit line pairs upon receipt of the column-address information signals;
   a sense amplifier, operatively connected to said plurality of bit lines, for amplifying the difference in potential between a pair of bit lines selected by said column-address means and providing an output potential;
   an output buffer, operatively connected to said sense amplifier, for maintaining and outputting a data output signal;
   a word driver, operatively connected to said row-addressing means, for activating said row-addressing means;
   a first clock signal-generating circuit, operatively connected to said word driver, for detecting the change of said row-address information signals and said column-address information signals and generating a first clock signal, the rise of said first clock signal setting said word driver; and
   a second clock signal-generating circuit, operatively connected to said plurality of word lines and said word driver, for detecting the change of the potential of said word lines and generating a second clock signal, the rise of said second clock signal resetting said word driver.

2. A device as set forth in claim 1, wherein said output buffer is controlled by said first clock signal, said output buffer generating a high potential signal, upon receipt of said first clock signal, regardless of the output potential of said sense amplifier.

3. A device as set forth in claim 1, further comprising inverter means, operatively connected between the output of said second clock signal-generating circuit and said load means, for cutting off said load means when said inverted signal of said second clock signal is a low potential.

4. A device as set forth in claim 1, wherein said word lines are operatively connected between said row-addressing means and said second clock signal-generating circuit.

5. A device as set forth in claim 1, wherein said first clock signal generating circuit comprises:
   signal generating circuits, respectively, operatively connected to receive the row address and column address information signals, for detecting a rise or fall in the row address or column address information signals and generating a pulse having a predetermined time period; and
   an OR gate, operatively connected to said signal generating circuits, for generating the first clock signal when any of the row address or column address information signals rises or falls.

6. A device as set forth in claim 1, wherein said second clock signal generating circuit comprises:
   signal generating circuits, respectively, operatively connected to receive the row-address information signals, for detecting a rise in the row-address information signals and generating a pulse having a predetermined time period; and
   an OR gate, operatively connected to said signal generating circuits, for generating the second clock signal.

7. A device as set forth in claim 3, wherein said first clock signal generating means is operatively connected to said output buffer.

* * * * *